United States Patent
Hu (10) Patent No.: US 9,059,399 B2
(45) Date of Patent: *Jun. 16, 2015

(54) MAGNETIC MATERIALS WITH ENHANCED PERPENDICULAR ANISOTROPY ENERGY DENSITY FOR STT-RAM

(71) Applicant: International Business Machines Corporation, Armonk, NY (US)

(72) Inventor: Guohan Hu, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 77 days.

This patent is subject to a terminal disclaimer.

(21) Appl. No.: 13/911,602

(22) Filed: Jun. 6, 2013

(65) Prior Publication Data
US 2014/0361390 A1    Dec. 11, 2014

(51) Int. Cl.
*H01L 29/82* (2006.01)
*H01L 43/12* (2006.01)
*H01L 43/08* (2006.01)
*H01L 43/10* (2006.01)

(52) U.S. Cl.
CPC .......... *H01L 43/12* (2013.01); *H01L 43/08* (2013.01); *H01L 43/10* (2013.01)

(58) Field of Classification Search
CPC .. H01L 43/08; H01L 21/67708; H01L 27/222
USPC ............................. 257/421, 422, 428, 435
See application file for complete search history.

(56) References Cited

U.S. PATENT DOCUMENTS

| | | |
|---|---|---|
| 5,290,609 A | 3/1994 | Horiike et al. |
| 7,727,911 B2 | 6/2010 | Yoneda et al. |
| 8,183,652 B2 | 5/2012 | Ranjan et al. |
| 8,324,697 B2 | 12/2012 | Worledge |
| 8,493,695 B1 | 7/2013 | Kaiser et al. |
| 2003/0228497 A1 | 12/2003 | Wu et al. |
| 2005/0185455 A1 | 8/2005 | Huai |
| 2005/0231854 A1 | 10/2005 | kawai |
| 2008/0088980 A1 | 4/2008 | Kitagawa et al. |
| 2010/0020592 A1 | 1/2010 | Hosotani et al. |
| 2010/0096716 A1 | 4/2010 | Ranjan et al. |
| 2011/0260270 A1 | 10/2011 | Zhang et al. |
| 2012/0018823 A1 | 1/2012 | Huai et al. |
| 2012/0063218 A1 | 3/2012 | Huai et al. |
| 2012/0087185 A1 | 4/2012 | Zhou et al. |

(Continued)

OTHER PUBLICATIONS

T.-I. Cheng et al., "Perpendicular magnetic anisotropy induced by a cap layer in ultrathin MgO/CoFeB/Nb," Journal of Applied Physics, vol. 112, No. 3, 2012, 033910, 4 pages.

(Continued)

*Primary Examiner* — Tan N Tran
(74) *Attorney, Agent, or Firm* — Cantor Colburn LLP; Vazken Alexanian (57) ABSTRACT

A mechanism is provided for a spin torque transfer random access memory device. A reference layer is disposed on a seed layer. A tunnel barrier is disposed on the reference layer. A free layer is disposed on the tunnel barrier. A cap layer is disposed on the free layer. The free layer includes a magnetic layer and a metal oxide layer, in which the magnetic layer is disposed on the tunnel barrier and the metal oxide layer is disposed on the magnetic layer. A metal material used in the metal oxide layer includes at least one of Ti, Ta, Ru, Hf, Al, La, and any combination thereof.

2 Claims, 5 Drawing Sheets

(56) References Cited

U.S. PATENT DOCUMENTS

| | | | |
|---|---|---|---|
| 2012/0135273 A1* | 5/2012 | Horng et al. | 428/828.1 |
| 2012/0175717 A1 | 7/2012 | Bessho et al. | |
| 2012/0188818 A1 | 7/2012 | Ranjan et al. | |
| 2012/0205758 A1 | 8/2012 | Jan et al. | |
| 2012/0217595 A1 | 8/2012 | Zhou et al. | |
| 2012/0236631 A1 | 9/2012 | Park et al. | |
| 2012/0241878 A1 | 9/2012 | Hu et al. | |
| 2012/0280336 A1 | 11/2012 | Jan et al. | |
| 2014/0048893 A1 | 2/2014 | Wu et al. | |

OTHER PUBLICATIONS

G. Jan et al., "High Spin Torque Efficiency of Magnetic Tunnel Junctions iith MgO/CoFeB/MgO Free Layer" Applied Physics Express, vol. 5, No. 9, 2012, 093008, 3 pages.

J. H. Jung et al., "Strong perpendicular magnetic anisotropy in thick CoFeB films sandwiched by Pd and MgO layers," Applied Physics Letters, vol. 96, No. 4, 2010; 042503, 3 pages.

T. Liu et al., "Large enhanced perpendicular magnetic anisotropy in CoFeB/Mig0 system with the typical Ta buffer replaced by an Hf layer," AIP Advances, vol. 2, No. 3, 2012, 032151, 7 pages.

V. B. Naik et al., "Thick CoFeB with perpendicular tnagnetic anisotropy in CoFeB-MgO based magmetic tunnel junction," AIP Advances 2, No. 4, 2012, 042182, 9 pages.

J. J. Nowak, et al., "Demonstration of ultralow bit error rates for spin-torque magnetic random-access memory with perpendicular magnetic anisotropy." IEEE Magnetics Letters, vol. 2, 2011, 3000204, 4 pages.

Sato et al., "Perpendicular-anisotropy CoFeB-MgO magnetic tunnel junctions with a MgO/CoFeB/Ta/CoFeB/MgO recording structure," Applied Physics Letters 101, 022414 (2012), 5 pages.

D. C. Worledge et al., "Spin torque switching of perpendicular Ta ?CoFeB ? MgO-based magnetic tunnel junctions," Applied Physics Letters, vol. 98, 2011, 022501, 4 pages.

Choi, G-M., et al., "L10 Ordering of FePtB Films on a Thin MgO Layer," Applied Physics Express 4, Jan. 2011, (023001, pp. 1-3).

* cited by examiner

FIG. 1B

MAGNETIC MATERIALS WITH ENHANCED PERPENDICULAR ANISOTROPY ENERGY DENSITY FOR STT-RAM

BACKGROUND

The present invention relates generally to spin torque transfer, and more specifically, to materials in and configurations for a spin torque transfer random access memory device.

Spin transfer torque is an effect in which the orientation of a magnetic layer in a magnetic tunnel junction or spin valve can be modified using a spin-polarized current. Charge carriers (such as electrons) have a property known as spin which is a small quantity of angular momentum intrinsic to the carrier. An electrical current is generally unpolarized (consisting of 50% spin-up and 50% spin-down electrons). A spin polarized current is one with more electrons of either spin. By passing a current through a thick magnetic layer, one can produce a spin-polarized current. If a spin-polarized current is directed into a magnetic layer, angular momentum can be transferred to the magnetic layer, changing its magnetic orientation. This can be used to flip the orientation of the magnet.

BRIEF SUMMARY

According to an exemplary embodiment, a spin torque transfer random access memory device is provided. The device includes a reference layer disposed on a seed layer, a tunnel barrier disposed on the reference layer, a free layer disposed on the tunnel barrier, and a cap layer disposed on the free layer. The free layer includes a magnetic layer and a metal oxide layer, where the magnetic layer is disposed on the tunnel barrier and the metal oxide layer is disposed on the magnetic layer. A metal material used in the metal oxide layer includes at least one of Mg, Ti, Ta, Ru, Hf, Al, La, and any combination thereof.

According to another exemplary embodiment, a spin torque transfer random access memory device is provided. The device includes a reference layer disposed on a seed layer, a tunnel barrier disposed on the reference layer, a free layer disposed on the tunnel barrier, and a cap layer disposed on the free layer. The free layer includes a first magnetic layer disposed on the tunnel barrier, a spacer layer disposed on the first magnetic layer, a second magnetic layer disposed on the spacer layer, and a metal oxide layer disposed on the second magnetic layer. The metal material used in the metal oxide layer includes at least one of Mg, Ti, Ta, Ru, Hf, Al, La, and any combination thereof.

According to another exemplary embodiment, a method of forming a spin torque transfer random access memory device is provided. The method includes disposing a reference layer on a seed layer, disposing a tunnel barrier on the reference layer, disposing a free layer on the tunnel barrier, and disposing a cap layer on the free layer. The free layer may be formed by disposing a first magnetic layer on the tunnel barrier, disposing a spacer layer on the first magnetic layer, disposing a second magnetic layer on the spacer layer, and disposing a metal oxide layer on the second magnetic layer. Alternatively, the free layer may be formed by disposing the first magnetic layer on the tunnel barrier and disposing the metal oxide layer on the first magnetic layer. The metal material used in the metal oxide layer includes at least one of Mg, Ti, Ta, Ru, Hf, Al, La, and any combination thereof.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments disclose a new class of cap materials which can enhance the perpendicular anisotropy of a CoFeB layer significantly without sacrificing junction resistance area product (RA) and tunnel magnetoresistance (TMR).

A CoFeB layer with perpendicular anisotropy has been identified as one of the most promising materials for the free layer in STT-RAM devices. Compared to other candidate materials, CoFeB has a few distinct advantages including low damping for lower write voltage and good structure match with an MgO tunnel barrier for high TMR. TMR is a magnetoresistive effect that occurs in a magnetic tunnel junction (MTJ), which is a component consisting of two ferromagnets separated by a thin insulator. If the insulating layer is thin enough (typically a few nanometers), electrons can tunnel from one ferromagnet into the other.

However, when the CoFeB layer (i.e., free layer) is sandwiched between the tunnel barrier and a Ta cap (layer), the energy density ($M_s t H_k$) of this material (CoFeB layer) is not particularly high. Since the energy density is directly related to the thermal activation energy of the patterned STT-RAM device, a low energy density material will not meet the retention requirement in small STT-RAM devices, thus affecting the scalability of this material (CoFeB layer). $M_s$ is the saturation magnetization of the free layer material, t is the thickness of the free layer, and $H_k$ is the perpendicular anisotropy field of the free layer. The thermal activation energy barrier of a patterned device $= M_s t \cdot H_k \cdot A$, where A is the area of the patterned device, when the device size is small. $M_s t H_k$ product is referred to as energy density. For a given device size, the higher the $M_s t H_k$ product, the higher the thermal activation energy barrier which translates to better retention.

Embodiments disclose free layer materials and structures that have high perpendicular magnetic anisotropy energy density. Perpendicular magnetic anisotropy energy density refers to the product of free layer saturation magnetization $M_s$, free layer thickness t, and perpendicular anisotropy field $H_k$.

There have been reports on a CoFeB layer sandwiched by two MgO tunnel barriers with enhanced energy density. However, in that case, the resistance area product (RA) is increased (because of the existence of two tunnel barriers and the resistance adds up). Accordingly, the TMR will be deteriorated. Note that there is a delicate balance between perpendicular magnetic anisotropy (PMA) energy density and junction RA in this material system. By choosing the right cap materials and oxidation condition, the PMA energy density can be largely improved without affecting the junction RA. In a patterned device, the junction resistance across the tunnel barrier=RA (resistance area product)/area A.

In embodiments, the cap materials that enhance CoFeB PMA energy density include Mg oxide, Ti oxide, Mg/Ti oxide, and Mg/Ta oxide. In this case, the oxides were made by depositing metal layers first and then oxidizing the metal layers by natural or radical oxidation. In oxide caps, the metal layer thickness is between 1 A to 10 A. Both the PMA energy density and junction RA depend on the thickness and detailed oxidation condition of the metal layers.

Magnetic anisotropy is the directional dependence of a material's magnetic properties. In the absence of an applied magnetic field, a magnetically isotropic material has no preferential direction for its magnetic moment, while a magnetically anisotropic material will align its moment with one of the easy axes (as discussed herein perpendicular magnetic anisotropy (PMA) is aligned perpendicularly). An easy axis is an energetically favorable direction of spontaneous magnetization that is determined by the sources of magnetic anisotropy.

Figure 1A:
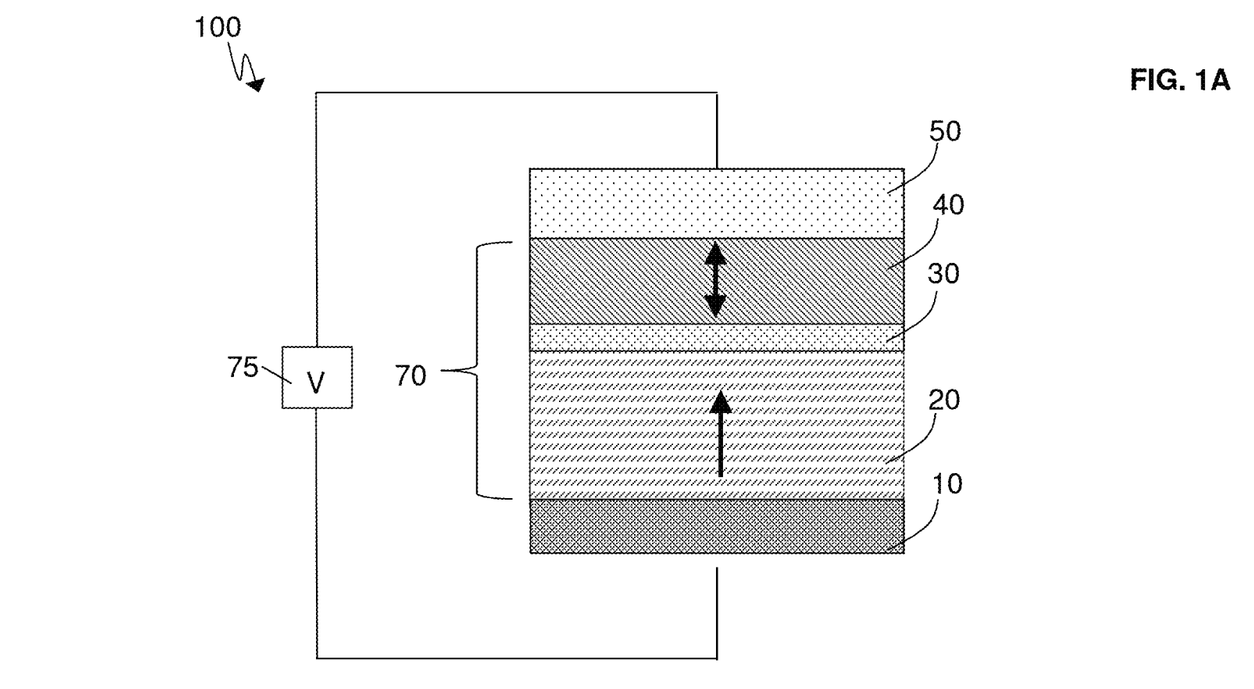
FIG. 1A illustrates a cross-sectional view of a spin torque transfer random access memory (STT-RAM) device according to an embodiment.
Figure 1B:
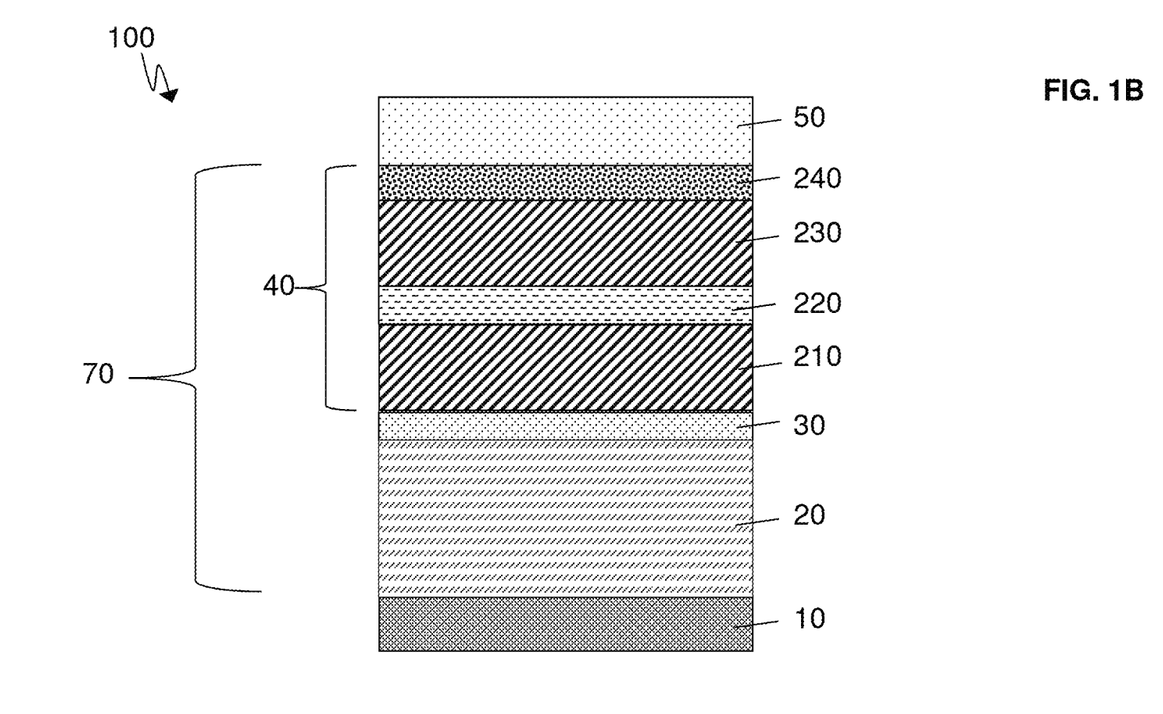
FIG. 1B illustrates a cross-sectional view of the STT-RAM device with an exemplary structure for the free magnetic layer according to an embodiment.

According to embodiments, it was also found that when the single CoFeB layer is replaced by a trilayer structure (as shown in FIG. 1B), the junction RA can be lowered. This trilayer structure includes two CoFeB layers separated by a spacer layer. The spacer layer can be Ta or Ti, with a thickness between 0.5 A to 5 A.

Now turning to the figures, FIG. 1A illustrates a cross-sectional view of a spin torque transfer random access memory (STT-RAM) device 100 utilizing magnetic materials with perpendicular magnetic anisotropy according to an embodiment. The device structure of the STT-RAM device 100 includes a magnetic tunnel junction (MTJ) 70. The magnetic tunnel junction 70 has a reference magnetic layer 20, a tunnel barrier 30 on the reference magnetic layer 20, and a free magnetic layer 40 on the tunnel barrier 30. The reference magnetic layer 20 is on a seed layer 10. The seed layer 10 can be different materials depending on the exact reference magnetic layer 20 and to grow the reference magnetic layer 20. A cap layer 50 is disposed on the free magnetic layer 40. The reference magnetic layer 20 and the free magnetic layer 40 sandwich the tunnel barrier 30 in between. The tunnel barrier 30 is a thin insulator.

The free magnetic layer 40 is shown with double arrows to illustrate that spin torque current (or spin polarized current) via voltage source 75 can flip the magnetic orientation of the free magnetic layer 40 to up or down as desired. The reference magnetic layer 20 is shown with an up arrow to illustrate a magnetic orientation to the up direction. To write the STT-RAM device 100, the voltage source 75 applies voltage and a spin torque current can flip the magnetic orientation of the free magnetic layer 40 as desired. When the magnetic orientations of the free magnetic layer 40 and the reference magnetic layer 20 are parallel (i.e., pointing in the same direction), the resistance of the MTJ 70 is low (e.g., representing logic 1). When the magnetic orientations of the free magnetic layer 40 and the reference magnetic layer 20 are antiparallel (i.e., pointing in opposite directions), the resistance of the MTJ 70 is high (e.g., representing a logic 0).

FIG. 1B illustrates the STT-RAM device 100 with an exemplary structure of the free magnetic layer 40 according to an embodiment. In FIG. 1B, the free magnetic layer 40 is composed of a first magnetic layer 210, a spacer layer 220, and a second magnetic layer 230. The first magnetic layer 210 is made of at least one of the following materials: Fe, CoFe, CoFeB, CoPt, FePt, CoPd, FePd, and/or any combination thereof. The second magnetic layer 230 is made of at least one of the following materials: Fe, CoFe, CoFeB, CoPt, FePt, CoPd, FePd, and/or any combination thereof. The thickness of the first magnetic layer 210 ranges from 5 angstroms (Å) to 20 angstroms. The thickness of the second magnetic layer 230 ranges from 5 Å to 20 Å.

The spacer layer 220 is at least one of Ta, Ti, TiN, TaN, TaMg, TiMg and/or any combination thereof. The spacer layer 220 has a thickness ranging from 0.5 Å to 10 Å. The first magnetic layer 210 and the second magnetic layer 230 are ferromagnetically coupled through the spacer layer 220. Accordingly, the first magnetic layer 210 and the second magnetic layer 230 are configured to maintain the same magnetic orientation via the spacer layer 220. When the voltage source 75 (not shown in FIGS. 1B and 1C for the sake conciseness) generates the spin torque current (spin polarized current) as understood by one skilled in the art, the magnetic orientations (maintained in the same direction with respect to one another) of the first magnetic layer 210 and the second magnetic layer 230 (forming the free magnetic layer 40) are both flipped in the same direction according to the angular momentum of the spin torque current. Accordingly, based on the ferromagnetically coupled first and second magnetic layers 210 and 230 (i.e., free magnetic layer 40) being parallel to the reference magnetic layer 20, the resistance is low and the logic state is 1. On the other hand, based on the ferromagnetically coupled first and second magnetic layers 210 and 230 (i.e., free magnetic layer 40) being antiparallel to the reference magnetic layer 20, the resistance is high and the logic state is 0.

Now, further discussion is provided regarding the metal oxide layer 240. In the first oxidation example, the metal oxide layer 240 is made by depositing metal layers first (for example metal layers of Mg and Ti) and then oxidizing the metal layers by an oxidation process. The oxidation process to oxidize the metal layers may include natural oxidation, or radical oxidation as understood by one skilled in the art.

In the second oxidation example, the metal oxide layer 240 is made by depositing metal layers (for example, metal layers of Mg and Ti) first, oxidizing the metal layers by an oxidation process, and then depositing another metal layer (for example a metal layer of Mg) after the oxidation process. The oxidation process to oxidize the metal layers may include natural oxidation, or radical oxidation as understood by one skilled in the art.

In the first and second oxidation examples for making the metal oxide layer 240, the metal layer material may include at least one of Mg, Ti, Ta, Ru, Hf, La, Al and any combination thereof. The metal layers used in metal oxide layer 240 have thicknessess between 1 Å to 20 Å.

The cap layer 50 is composed of at least one of Ru, Pd, Pt, Ta, TiN, and any combination thereof. The thickness of the cap layer 50 ranges from 2 Å to 40 Å (or more). The choice of this cap layer 50 has a significant impact on both free layer perpendicular magnetic anisotropy and junction RA.

Figure 1C:
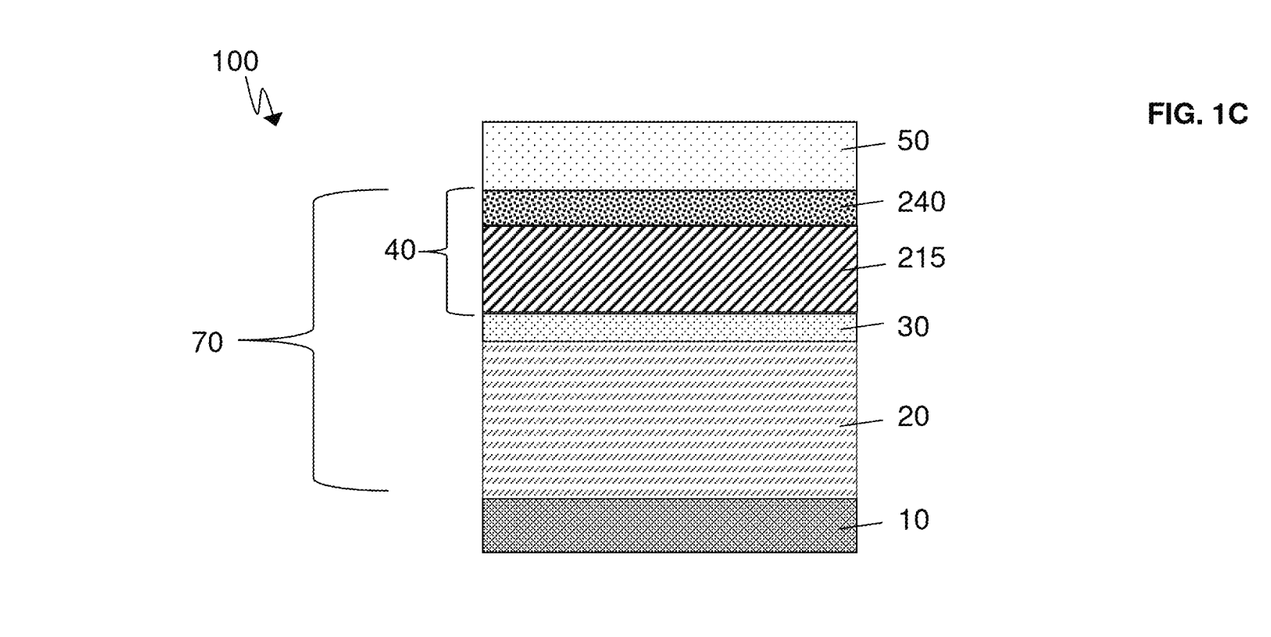
FIG. 1C illustrates a cross-sectional view of the STT-RAM device with an exemplary structure for the free magnetic layer according to another embodiment.

FIG. 1C illustrates the STT-RAM device 100 with an exemplary structure of the free magnetic layer 40 according to an embodiment. In FIG. 1C, the free magnetic layer 40 is composed of a magnetic layer 215 and the metal oxide layer 240. In this case, the metal oxide layer 240 is disposed on the magnetic layer 215, and the magnetic layer 215 is disposed on the tunnel barrier 30.

The magnetic layer 215 (of the free magnetic layer 40) is composed of at least one of the following materials: Fe, CoFe, CoFeB, CoPt, FePt, CoPd, FePd, and any combination thereof. The magnetic layer 215 has a thickness ranging from 10 Å to 30 Å. As noted above, the first and second oxidation examples may be utilized for making the metal oxide layer 240. In the first oxidation example, the metal oxide layer 240 is made by depositing metal layers first and then oxidizing the metal layers by an oxidation process. In the second oxidation example, the metal oxide layer 240 is made by depositing metal layers first, oxidizing the metal layers by an oxidation process, and then depositing another metal layer after the oxidation process. The metal layer material of the metal oxide layer 240 is at least one of Mg, Ti, Ta, Ru, Hf, Al and La. The metal layers used in metal oxide layer 240 have thicknesses between 1 Å to 20 Å.

Figure 2:
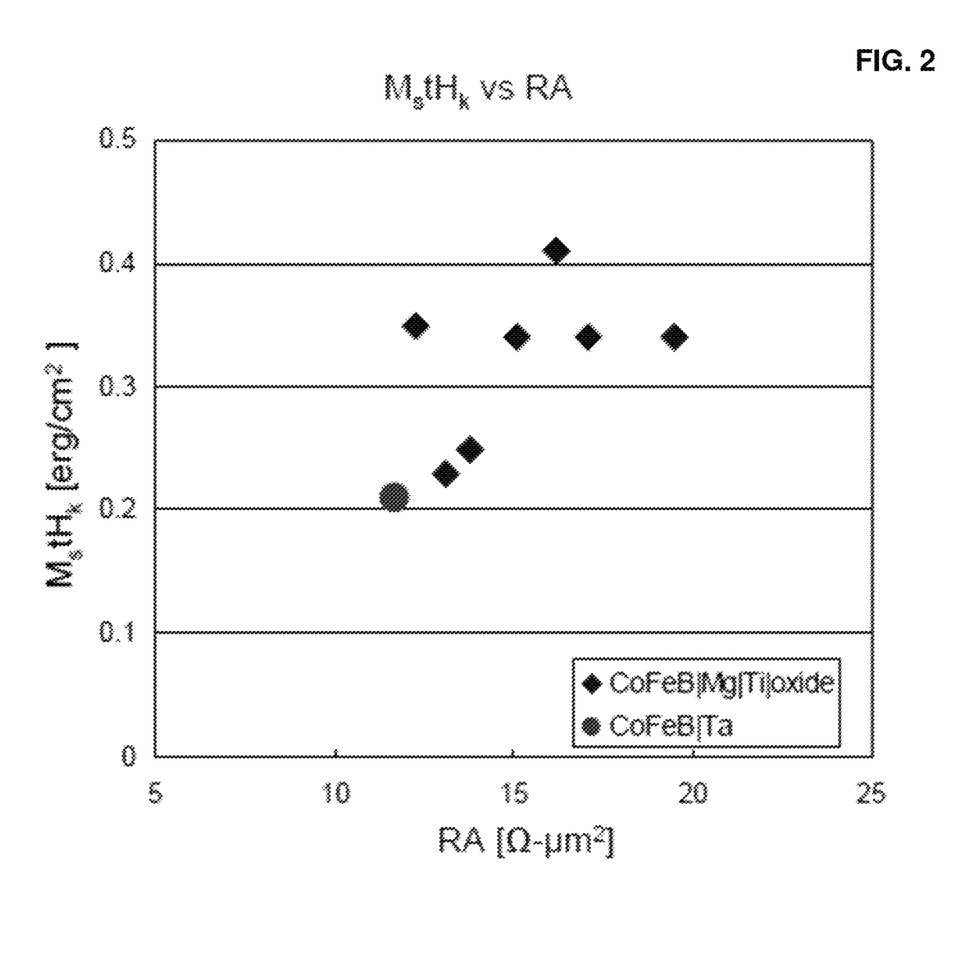
FIG. 2 is a chart of $M_s t H_k$ versus RA comparison according to an embodiment.

FIG. 2 is a chart 200 of the magnetic property of one particular example according to an embodiment. In this example, the STT-RAM device 100 sample contains a seed layer 10, a tunnel barrier 30, and a free magnetic layer 40. The free magnetic layer 40 includes the first magnetic layer 210 made of CoFeB, the space layer 220 made of Ta, the second magnetic layer 230 made of CoFeB, the metal oxide layer 240 made of a Mg|Ti oxide layer stack, and the cap layer 50 made of Ru. The Mg|Ti metal oxide layer 240 is made by depositing a metal layer of Mg, depositing a metal layer of Ti (on the metal layer of Mg), and then oxidizing the Mg|Ti layers by an oxidation process.

The vertical axis of the chart 200 shows the perpendicular magnetic anisotropy energy density $M_s t H_k$ measured on sheet films. The $M_s t H_k$ is in the unit of erg/cm$^2$, where erg is the unit of energy in the centimeter-gram-second (CGS) system of units. $H_k$ is the perpendicular magnetic anisotropy field. $M_s$ is saturation magnetization of the free layer, and t is the thickness of the free layer. The horizontal axis of the chart 200 shows the resistance area product (RA) in unit of ohm·μm$^2$ (Ω·μm$^2$), measured on sheet films.

In FIG. 2, the diamonds are the properties of a free layer with oxide cap, while the dot is from a similar free layer with a metal Ta cap. By adjusting the metal layer thickness and oxidation conditions, the $M_s t H_k$ product can be improved by 70-80% while keeping the RA more or less constant.

Figure 3:
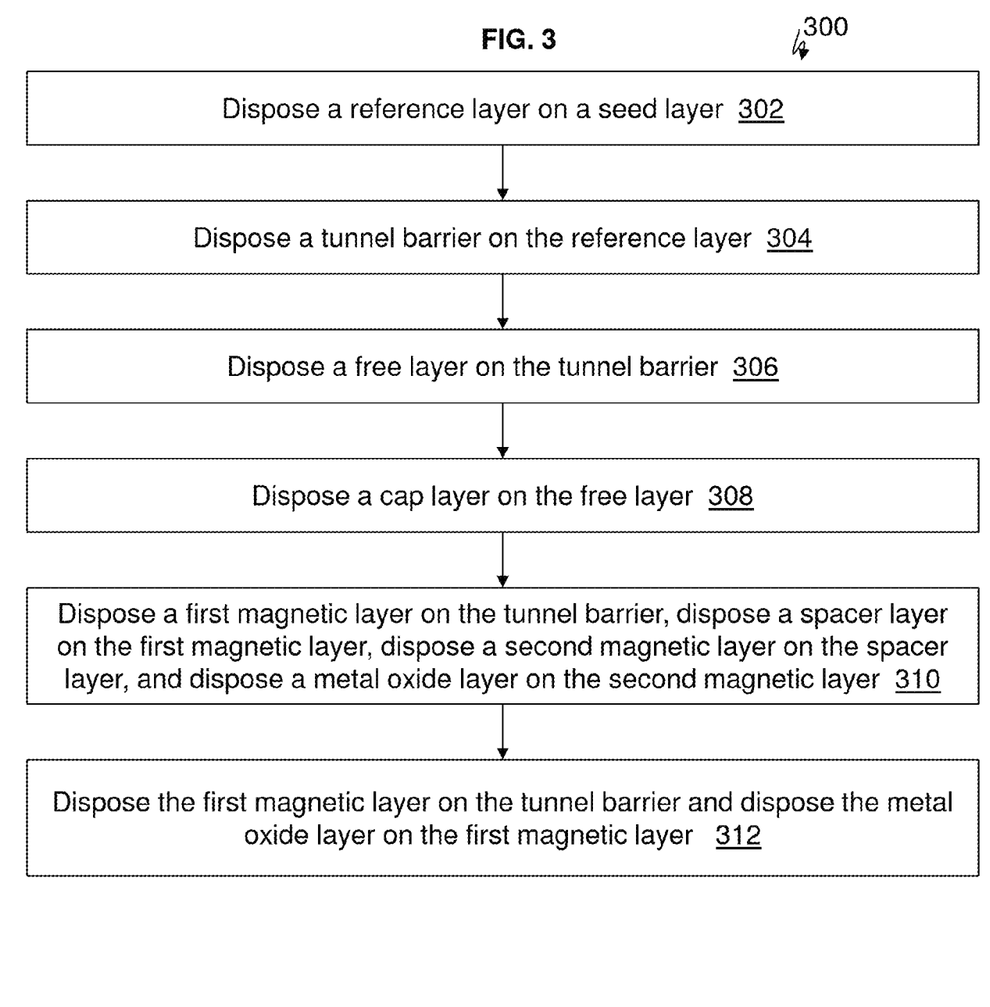
FIG. 3 illustrates a method of forming a spin torque transfer random access memory device according to an embodiment.

FIG. 3 illustrates a method 300 of forming a spin torque transfer random access memory device 100 according to an embodiment.

The reference magnetic layer 20 is disposed on (and/or grown from) the seed layer 10 at block 302. The tunnel barrier 30 is disposed on the reference magnetic layer 20 at block 304. The free magnetic layer 40 is disposed on the tunnel barrier 30 306. The cap layer 50 is disposed on the free magnetic layer 40 at block 308.

Disposing the free magnetic layer 40 include one of the following:

With reference to FIG. 1B, making/forming the free magnetic layer 40 includes disposing a first magnetic layer 210 on the tunnel barrier 30, disposing a spacer layer 220 on the first magnetic layer 210, disposing a second magnetic layer 230 on the spacer layer 220, and disposing a metal oxide layer 240 on the second magnetic layer 230 at block 310.

With reference to FIG. 1C, making/forming the free magnetic layer 40 includes disposing a magnetic layer 215 on the tunnel barrier and disposing the metal oxide layer 240 on the magnetic layer 215 at block 312. The metal oxide material of the metal oxide layer 240 includes at least one of Mg, Ti, Ta, Ru, Hf, Al, La, and any combination thereof.

In one case, the metal oxide material of the metal oxide layer 240 further includes Mg. In another case, the metal oxide material of the metal oxide layer 240 excludes and is free of Mg.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A spin torque transfer random access memory device consisting of: a reference layer disposed directly on a seed layer; a tunnel barrier disposed directly on the reference layer; a free layer disposed directly on the tunnel barrier; and a cap layer disposed directly on the free layer; wherein the free layer consisting of a first magnetic layer disposed directly on the tunnel barrier, a spacer layer disposed directly on the first magnetic layer, a second magnetic layer disposed directly on the spacer layer, and a metal oxide layer disposed directly on the second magnetic layer; wherein a metal material used in the metal oxide layer consisting of at least one of Ti, Ta, Ru, Hf, La, and wherein the cap layer consisting of at least one of Pd, Pt, Ta, TiN, wherein the spacer layer consisting of at least one of Ta, Ti, TiN, TaN, and wherein the first magnetic layer consisting of at least one of Fe, CoFe, CoFeB, CoPt, FePt, CoPd, FePd; and wherein the second magnetic layer consisting of at least one of Fe, CoFe, CoFeB, CoPt, FePt, CoPd, FePd; wherein the first magnetic layer has a thickness ranging from 5 angstroms to 20 angstroms; and wherein the second magnetic layer has a thickness ranging from 5 angstroms to 20 angstroms; wherein the cap layer has a thickness ranging from 2 angstroms to 40 angstroms; wherein the spacer layer has a thickness ranging from 0.5 angstrom to 10 angstroms.

2. The device of claim 1, wherein the metal material used in the metal oxide layer excludes and is free of Mg.

* * * * *